United States Patent
Kim

(10) Patent No.: US 11,727,552 B2
(45) Date of Patent: Aug. 15, 2023

(54) METHOD OF VERIFYING OPTICAL PROXIMITY EFFECT CORRECTION

(71) Applicant: Samsung Electronics Co., Ltd., Suwon-si (KR)

(72) Inventor: Kisung Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 415 days.

(21) Appl. No.: 16/947,909

(22) Filed: Aug. 24, 2020

(65) Prior Publication Data
US 2021/0241446 A1    Aug. 5, 2021

(30) Foreign Application Priority Data
Feb. 5, 2020    (KR) .......................... 10-2020-0013705

(51) Int. Cl.
*G06K 9/00*    (2022.01)
*G06T 7/00*    (2017.01)
(Continued)

(52) U.S. Cl.
CPC .............. *G06T 7/0004* (2013.01); *G03F 1/36* (2013.01); *G03F 1/84* (2013.01); *G03F 7/70441* (2013.01);
(Continued)

(58) Field of Classification Search
CPC ... G06T 7/0002; G06T 7/0004; G06T 7/0006; G06T 7/001; G06T 7/10; G06T 7/13; G06T 7/60; G06T 7/62; G06T 7/66; G06T 7/70; G06T 2207/10061; G06T 2207/20021; G06T 2207/30141; G06T 2207/30148; G03F 1/36; G03F 1/38; G03F 1/70;
(Continued)

(56) References Cited

U.S. PATENT DOCUMENTS 6,453,457 B1    9/2002    Pierrat et al.
6,470,489 B1 *  10/2002   Chang ....................... G03F 1/36
                                                 430/5
(Continued)

FOREIGN PATENT DOCUMENTS

JP        4068541         1/2008
KR    1020090042455       4/2009
(Continued)

*Primary Examiner* — Eric Rush
(74) *Attorney, Agent, or Firm* — Myers Bigel, P.A.

(57) ABSTRACT

A method of verifying optical proximity effect correction includes generating a design pattern layout including a target pattern, generating a correction pattern layout from the design pattern layout by performing optical proximity effect correction, generating a contour image including an image pattern using the correction pattern layout, detecting a defect pattern from the image pattern of the contour image, and correcting the correction pattern layout using data of the defect pattern. Detecting the defect pattern includes acquiring position data of a center of gravity of the target pattern, acquiring position data of a center of gravity of the image pattern, and determining whether the image pattern is a defect pattern by comparing a defect pattern detection reference with a distance between the center of gravity of the target pattern and the center of gravity of the image pattern.

20 Claims, 7 Drawing Sheets

(51) Int. Cl.
*G06T 7/60* (2017.01)
*G06T 7/70* (2017.01)
*G03F 1/36* (2012.01)
*G03F 7/00* (2006.01)
*G03F 1/84* (2012.01)
*G06T 7/66* (2017.01)
*G06F 30/398* (2020.01)

(52) U.S. Cl.
CPC .............. *G06F 30/398* (2020.01); *G06T 7/60* (2013.01); *G06T 7/66* (2017.01); *G06T 7/70* (2017.01); *G06T 2207/10061* (2013.01); *G06T 2207/20021* (2013.01); *G06T 2207/30148* (2013.01)

(58) Field of Classification Search
CPC ..... G03F 1/72; G03F 1/76; G03F 1/82; G03F 1/84; G03F 7/70308; G03F 7/70425; G03F 7/70433; G03F 7/70441; G03F 7/705; G03F 7/706; G03F 7/70616; G03F 7/70633; G03F 7/7065; G03F 7/70666; G03F 7/70675; G03F 7/70683; G06F 30/20; G06F 30/398
USPC ....... 382/100, 141, 144–147, 149, 151, 195, 382/199, 282, 283, 288, 291, 312, 325; 716/50–56, 100, 103, 104, 106, 110–112; 430/4, 5; 378/34, 35; 438/4, 5, 7, 14, 438/16, 22; 703/13, 14
See application file for complete search history.

(56) References Cited

U.S. PATENT DOCUMENTS

| | | | | |
|---|---|---|---|---|
| 7,225,112 | B2 * | 5/2007 | Uraki | G06F 30/23 703/2 |
| 7,275,227 | B1 | 9/2007 | Ying | |
| 7,487,491 | B2 * | 2/2009 | Oaki | G06T 7/001 382/144 |
| 8,302,035 | B2 * | 10/2012 | Choi | G03F 1/36 716/54 |
| 8,423,920 | B2 * | 4/2013 | Lee | G06F 30/39 700/121 |
| 8,423,921 | B2 * | 4/2013 | Handa | G03F 1/78 716/51 |
| 8,607,169 | B2 | 12/2013 | Leu | |
| 8,812,998 | B2 | 8/2014 | Tao et al. | |
| 8,997,027 | B2 | 3/2015 | Hamouda et al. | |
| 9,122,160 | B2 * | 9/2015 | Chua | G03F 1/36 |
| 9,495,507 | B2 | 11/2016 | Yu et al. | |
| 9,672,611 | B2 | 6/2017 | Yang et al. | |
| 10,170,495 | B2 * | 1/2019 | Kim | G06F 30/398 |
| 2005/0086618 | A1 | 4/2005 | Ito et al. | |
| 2006/0008135 | A1 * | 1/2006 | Nojima | G06T 7/001 382/145 |
| 2010/0115765 | A1 * | 5/2010 | Hamamoto | G06F 30/398 716/106 |
| 2010/0303334 | A1 * | 12/2010 | Kitamura | G06T 7/001 382/141 |
| 2013/0000505 | A1 | 1/2013 | Tao et al. | |
| 2013/0174102 | A1 | 7/2013 | Leu | |
| 2014/0212024 | A1 | 7/2014 | Chen et al. | |
| 2015/0040080 | A1 | 2/2015 | Hamouda et al. | |
| 2016/0071261 | A1 | 3/2016 | Yang et al. | |
| 2016/0154925 | A1 | 6/2016 | Yu et al. | |

FOREIGN PATENT DOCUMENTS

KR 1020100127671 12/2010
KR 102013481 8/2019

* cited by examiner (a)  (b)  (c)

METHOD OF VERIFYING OPTICAL PROXIMITY EFFECT CORRECTION

CROSS-REFERENCE TO THE RELATED APPLICATION

This application claims priority from Korean Patent Application No. 10-2020-0013705, filed on Feb. 5, 2020, in the Korean Intellectual Property Office, the disclosure of which is incorporated herein by reference in its entirety.

BACKGROUND

1. Field

Apparatuses and methods consistent with the disclosure relate to methods of verifying optical proximity effect correction.

2. Description of the Related Art

Along with the development of small-sized and highly-integrated semiconductor devices, a distance between patterns may be very short and the size of a mask pattern may approach a wavelength of a light source. Due to such proximity between patterns, interference and diffraction of light may occur to form a distorted pattern that is different from a desired pattern shape on a substrate. To address this problem, a resolution enhancement technology, such as optical proximity effect correction, has been developed.

SUMMARY

The example embodiments of the disclosure provide methods of verifying optical proximity effect correction for detecting a defect pattern with defect symmetry.

A method of verifying optical proximity effect correction may include generating a design pattern layout including a target pattern, generating a correction pattern layout from the design pattern layout by performing optical proximity effect correction, generating a contour image including an image pattern using the correction pattern layout, detecting a defect pattern from the image pattern of the contour image, and correcting the correction pattern layout using data of the defect pattern, wherein the detecting the defect pattern may include acquiring position data of a center of gravity of the target pattern, acquiring position data of a center of gravity of the image pattern, and determining whether the image pattern is a defect pattern by comparing a defect pattern detection reference with a distance between the center of gravity of the target pattern and the center of gravity of the image pattern, and wherein the acquiring the position data of the center of gravity of the image pattern may include splitting the image pattern into a plurality of fine patterns, and collecting position data of a center of gravity of each of the plurality of fine patterns.

A method of verifying optical proximity effect correction may include generating a design pattern layout including a target pattern, generating a correction pattern layout from the design pattern layout by performing optical proximity effect correction, generating a simulation pattern by performing a simulation using the correction pattern layout, and detecting a defect pattern from the simulation pattern, wherein the detecting the defect pattern may include acquiring position data of a center of gravity of the target pattern, acquiring position data of a center of gravity of the simulation pattern, and determining whether the simulation pattern is the defect pattern using the position data of the center of gravity of the target pattern and the position data of the center of gravity of the simulation pattern.

A method of verifying optical proximity effect correction may include generating a design pattern layout including a target pattern, generating a correction pattern layout from the design pattern layout by performing optical proximity effect correction, forming a wafer pattern on a wafer using the correction pattern layout, generating a contour image including an image pattern corresponding to the wafer pattern, and detecting a defect pattern from the image pattern of the contour image, wherein the detecting the defect pattern may include setting a defect pattern detection reference, acquiring position data of a center of gravity of the image pattern, and determining whether the wafer pattern is the defect pattern using the defect pattern detection reference and the position data of the center of gravity of the image pattern, wherein the acquiring the position data of the center of gravity of the image pattern may include splitting the image pattern into a plurality of fine patterns, collecting position data of a center of gravity of each of the plurality of fine patterns, and calculating the position data of the center of gravity of the image pattern, the position data (CoM) of the center of gravity of the image pattern being represented by the expression:

$$CoM = \sum \frac{\vec{r}_i \cdot d_i}{D}$$

where i is a natural number equal to or greater than 1 and equal to or less than n, n is a natural number equal to or greater than 2, $\vec{r}_i$ is position data of the center of gravity of an $i^{th}$ fine pattern among the plurality of fine patterns, $d_i$ is an area of an $i^{th}$ fine pattern among the plurality of fine patterns, and D is an entire area of the plurality of fine patterns.

A computer-readable recording medium may have recorded thereon a program for executing the method.

A program may be stored in a medium for executing the method in a computer.

DETAILED DESCRIPTION OF EXAMPLE EMBODIMENTS

Figure 1:
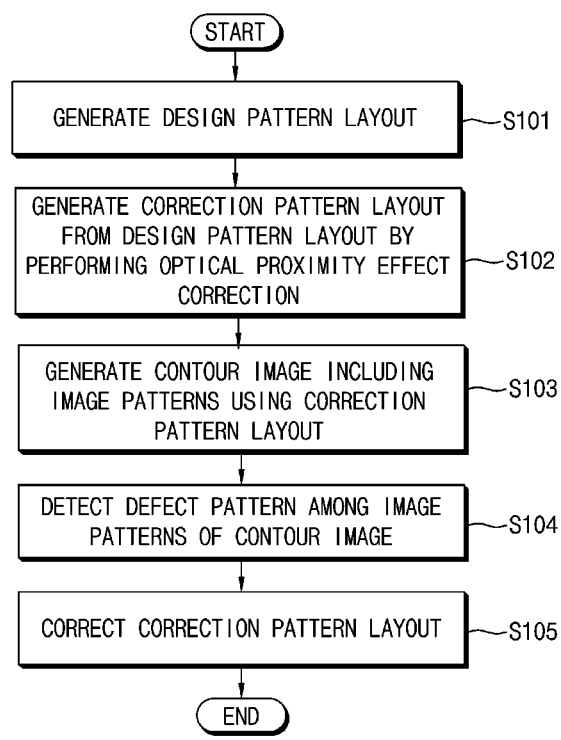
FIG. 1 is a schematic flowchart that illustrates methods of verifying optical proximity effect correction according to some embodiments of the inventive concept.
Figure 2:
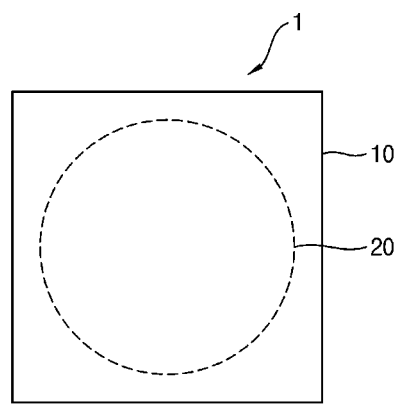
FIG. 2 is a conceptual diagram that illustrates a target pattern included in a design pattern layout and a real pattern on a wafer formed using the target pattern according to some embodiments of the inventive concept.
Figure 3:
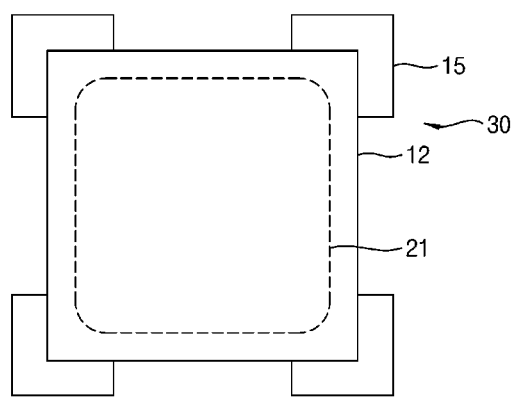
FIG. 3 is a conceptual diagram that illustrates a standard pattern and a correction pattern that are included in a correction pattern layout, and a real pattern on a wafer formed using the standard pattern and the correction pattern according to some embodiments of the inventive concept.

FIG. 1 is a schematic flowchart that illustrates methods of verifying optical proximity effect correction according to some embodiments of the inventive concept. FIG. 2 is a conceptual diagram for explaining a target pattern 10 included in a design pattern layout and a real pattern 20 on a wafer formed using the target pattern 10. FIG. 3 is a conceptual diagram for explaining a standard pattern 12 and a correction pattern 15 that are included in a correction pattern layout 30, and a real pattern 21 on a wafer formed using the standard pattern 12 and the correction pattern 15. Shapes of the patterns illustrated in FIGS. 2 and 3 are illustrated for understanding of the example embodiments of the disclosure and do not limit the exemplary embodiments of the disclosure.

Referring to FIG. 1, some embodiments of the method may include generating a design pattern layout (S101), generating a correction pattern layout from a design pattern layout by performing optical proximity effect correction (S102), generating a contour image including an image pattern using the correction pattern layout (S103), detecting a defect pattern among image patterns of the contour image (S104), and correcting the correction pattern layout (S105).

Referring to FIGS. 1 and 2, the method may include generating the design pattern layout 1 including the target pattern 10 (S101). The design pattern layout 1 may include a layout of target patterns. The target pattern 10 may refer to an initial design pattern that is formed on a mask pattern used in an exposure process to form the real pattern 20 to be embodied on a substrate such as a wafer. That is, the target pattern 10 on the mask pattern may be transferred to the substrate through the exposure process and the real pattern 20 may be formed on the substrate. In general, according to the characteristics of the exposure process, the layout of the real pattern 20 may have a distorted shape from a shape of the layout of the target pattern 10 due to interference, diffraction, etc. of light.

The design pattern layout 1 may include various shapes of target patterns. The design pattern layout 1 may be configured with a combination of various polygons. For example, the design pattern layout 1 may include one or more of a line pattern, a contact pattern, a corner pattern, and a slot pattern. The design pattern layout 1 may include design data. For example, the design data may be provided as a coordinate value of a contour of a design pattern layout 1 from a CAD system. The generating of the design pattern 1 layout may include designing a layout and/or acquiring design data from a database.

Referring to FIGS. 1 to 3, some embodiments of the method may include generating the correction pattern layout 30 from a design pattern layout 1 by performing optical proximity effect correction (S102). The optical proximity effect correction may refer to a technology for correcting the design pattern layout 1 to reduce or prevent a distortion phenomenon that may occur in a lithography process or pattern transfer process for embodying the design pattern layout 1 on a wafer. For example, the optical proximity effect correction may include one or more of adjusting the overall size of each pattern of the design pattern layout 1 and processing a corner portion, moving an edge of a pattern, adding polygons, or the like. For example, the pattern of the correction pattern layout 30 on which optical proximity effect correction is performed may include the standard pattern 12, which is a main pattern, and the correction pattern 15 added to the standard pattern 12. For example, the correction pattern layout 30 illustrated in FIG. 3 may be created to form the real pattern 21 of which a rounding phenomenon is suppressed compared with the real pattern 20 illustrated in FIG. 2.

The optical proximity effect correction may include a model-based optical proximity effect correction method of applying only a single model to a full-chip or a rule-based optical proximity effect correction method of applying one type of rule to a full-chip.

In the model-based optical proximity effect correction, a test mask having a preset number of test patterns may be formed, and a test substrate may be formed using the test mask. An optical proximity effect correction model may be used for representing a transfer process in consideration of an optical proximity effect based on a measurement result of the length of a pattern of the test substrate. In the model-based optical proximity effect correction, a shape difference between a pattern on the test mask and a pattern transferred to the substrate from the test mask may be simulated using an optical proximity effect correction model, and the mask pattern may be corrected according to the simulation result.

In the rule-based optical proximity effect correction, a test mask having a test pattern indicating all patterns allowed in a design may be formed, the test pattern of the test mask may be transferred to a substrate, and the substrate may be etched to form a test substrate. A design rule for changing test pattern design information based on length measurement information of a pattern shape of the test substrate and pattern design information of the test mask may be generated. In the rule-based optical proximity effect correction, the test pattern of the test mask may be corrected based on the design rule.

The optical proximity effect correction may be performed using the above methods and a correction pattern layout on which shapes or positions of patterns are changed from the design pattern layout may be generated. The correction pattern layout may include correction pattern layout data provided in a coordinate value of a contour. The correction pattern layout 30 may be a layout that is displayed on a computer monitor rather than being formed on a mask substrate.

Some embodiments of the method may include generating a contour image including an image pattern using the generated correction pattern layout (S103). Generating the contour image may include a method of generating a simulation pattern from the correction pattern layout through simulation and a method of generating a wafer pattern on a wafer using a correction pattern layout 30 and generating a contour pattern with respect to the wafer pattern. The simulation pattern and the contour pattern may be displayed on a computer monitor rather than being actually formed on a mask substrate, which will be described below in detail with reference to FIGS. 8 and 9.

Some embodiments of the method may include detecting a defect pattern among image patterns of the contour image (S104), which will be described below in detail with reference to FIG. 4.

Some embodiments of the method may include correcting the correction pattern layout using data about the defect pattern (S105). For example, a position of the correction pattern 15 with respect to the standard pattern 12 may be offset-corrected according to position data of the center of gravity of a pattern determined as a defect pattern among image patterns of the contour image, and the correction pattern layout 30 may be corrected.

Figure 4:
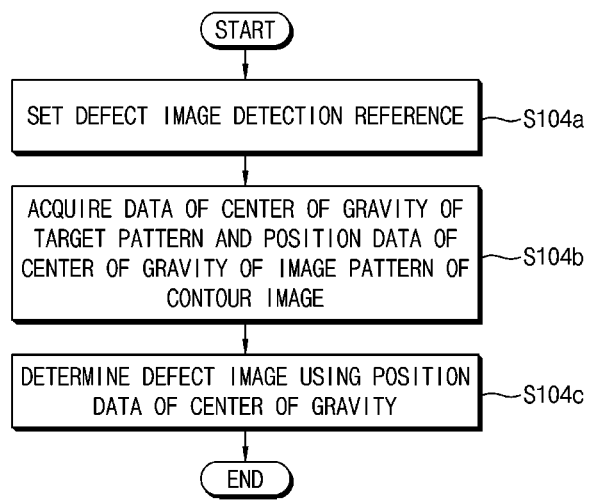
FIG. 4 is a flowchart that illustrates operations for detecting the defect pattern of FIG. 1 according to some embodiments of the inventive concept.
Figure 5:
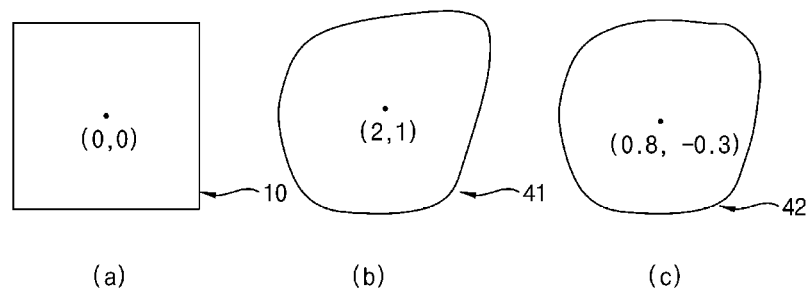
FIG. 5 shows the target pattern and image patterns of a contour image according to some embodiments of the inventive concept.

FIG. 4 is a flowchart that illustrates operations for detecting the defect pattern (S104) of FIG. 1 according to some embodiments of the inventive concept. FIG. 5 illustrates the target pattern 10 and image patterns 41 and 42 of a contour image according to some embodiments of the inventive concept. In some embodiments, the defect pattern may be an asymmetrical pattern from which defects are not capable of being detected using a conventional evaluation point error (EPE) method. For example, EPE of the defect pattern may converge to 0, but an actual pattern may have a different shape from an ideal real pattern.

Referring to FIG. 4, the detecting of the defect pattern (S104) may include setting a defect pattern detection reference (S104a), acquiring position data of the center of gravity of the target pattern and the contour image (S104b), and determining whether a pattern corresponds to a defect pattern using the position data of the center of gravity (S104c). The detecting of the defect pattern (S104) may further include extracting defect pattern information. In some embodiments, the position data may be a coordinate value with respect to the X and Y axes.

The setting the defect pattern detection reference (S104a) may include setting a reference value with respect to a distance between the center of gravity of the target pattern and the center of gravity of the image pattern of the contour image to determine whether image patterns of the contour image correspond to the defect pattern. The reference value may be determined according to a layout of a design pattern. For example, the reference value may be determined based on one or more of the shape, size, type, intensity, or the like of the image pattern. In other embodiments, the reference value may be arbitrarily set by a user. When the reference value is preset, setting of the defect pattern detection reference may be omitted from the operations in accordance with some embodiments of the inventive concept.

In some embodiments, the setting the defect pattern detection reference (S104a) may further include setting position data on a wafer and/or setting position data in a contour image and selecting a pattern that is a defect pattern determination target among image patterns of the contour image.

The acquiring the position data of the center of gravity of the target pattern (S104b) may include calculating the position of the center of gravity of the target pattern based on an arbitrary point on a wafer as an original point. In some embodiments, the position data of the center of gravity of the target pattern may be set to have the original point of (0,0) (grid coordinates) on a wafer.

The acquiring the position data of the center of gravity of the contour image (S104b) will be described below in detail with reference to FIG. 6.

The determining the defect image (S104) may include calculating a distance between the center of gravity of the target pattern and the center of gravity of the contour image, and comparing the calculated distance with the defect pattern detection reference to determine the defect pattern. Referring to FIG. 5, FIG. 5A shows the center of gravity of the target pattern 10, and FIGS. 5B and 5C show arbitrary image patterns 41 and 42 of the contour image generated using the target pattern 10 of FIG. 5A. The patterns 10, 41, and 42 illustrated in FIGS. 5A, 5B, and 5C may have different shapes and may have different values for the center of gravity. It may be seen that the image pattern 41 of FIG. 5B having the center of gravity positioned relatively far apart from the center of gravity (0, 0) of the arbitrarily set target pattern 10 has a lower symmetry degree than the image pattern 42 of FIG. 5C. As such, as a result of calculation of the center of gravity with respect to image patterns, which need to have symmetrical shapes, when image patterns have different shapes, the center of gravity may also have different values. In addition, as a distance of the center of gravity from the original point is increased, a symmetry degree of the image pattern may be reduced. That is, the symmetry degree of the image pattern may be quantitatively represented through the center of gravity. Accordingly, when a distance between the center of gravity of the target pattern and the center of gravity of the image pattern of the contour image is greater than a detection reference of an arbitrary defect pattern, the corresponding image pattern may be determined as a defect pattern.

In some embodiments, extracting the defect pattern information may include extracting coordinates of the defect pattern and specifying a defect pattern determined as the defect pattern among image patterns.

Figure 6:
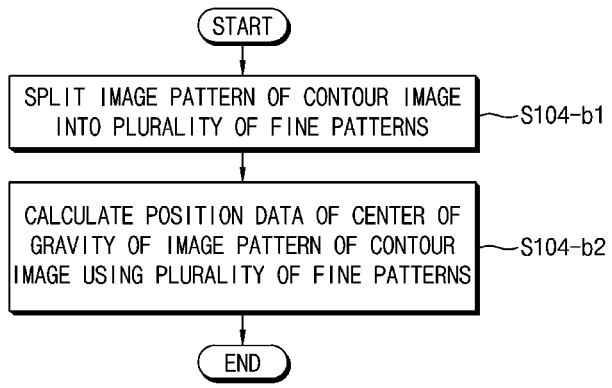
FIG. 6 is a flowchart that illustrates the position data of the center of gravity of the contour image of FIG. 4 according to some embodiments of the inventive concept.
Figure 7:
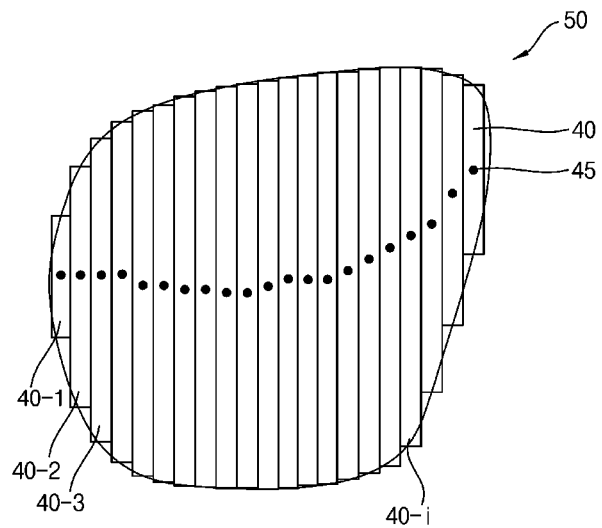
FIG. 7 is a conceptual diagram that illustrates an example in which an image pattern of a contour image is split into fine patterns according to some embodiments of the inventive concept.

FIG. 6 is a flowchart that illustrates the position data of the center of gravity of the contour image (S104b) of FIG. 4 according to some embodiments of the inventive concept. FIG. 7 is a conceptual diagram illustrating an example in which an image pattern 40 of a contour image is split into fine patterns.

Referring to FIGS. 6 and 7, acquiring the position data of the center of gravity of the target pattern included in the contour image (S104b) may include splitting the image pattern of the contour image into a plurality of fine patterns (S104-b1), and calculating the position data of the center of gravity of the image pattern using the plurality of fine patterns (S104-b2).

As shown in FIG. 7, the image pattern 40 of the contour image may be split into a plurality of fine patterns 40 (40-1, 40-2, 40-3, . . . 40-i, where i is a natural number equal to or greater than 1 and equal to or less than n and n is a natural number equal to or greater than 2.). In the specification, the "split" may not always mean that an image pattern of a contour image is physically split. A fine pattern 50 may be shaped like a rectangle close to a line shape having a narrow width and a long length. The fine patterns 50 may have the same width and may have different lengths. The plurality of fine patterns 50 may be arranged adjacent to each other in a longitudinal direction. Similar to an integral principle, the plurality of fine patterns 50 may be formed to substantially correspond to image patterns of the contour image. That is, the area of the image pattern 40 of the contour image may be substantially the same as the sum of the areas of the plurality of fine patterns 50.

To calculate the position data of the center of gravity of the image pattern 40 of the contour image, the position data of the center of gravity of each of the fine patterns 50 may be collected. In such embodiments, it may be assumed that intensities in the image pattern 40 of the contour image, that is, intensities of the plurality of fine patterns 50 are the same.

Thus, a position of a center of gravity 55 of each of the plurality of fine patterns 50 may be the center point of each of the fine patterns 50.

The collected position data of the center of gravity of each of the plurality of fine patterns 50 may be inserted into the following equation to acquire position data CoM of the center of gravity of the contour image.

$$CoM = \sum \frac{\vec{r}_i \cdot d_i}{D} \qquad \text{[Equation]}$$

Here, i is a natural number equal to or greater than 1 and equal to or less than n, n is a natural number equal to or greater than 2, $\vec{r}_i$ is position data of the center of gravity of an $i^{th}$ fine pattern among the plurality of fine patterns, $d_i$ is the area of an $i^{th}$ fine pattern among the plurality of fine patterns, and D is an entire area of the plurality of fine patterns.

Figure 8:
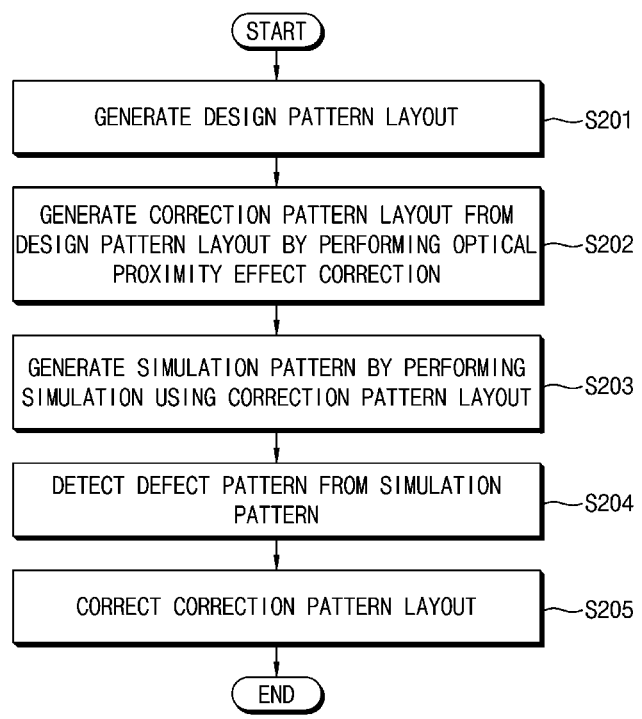
FIG. 8 is a schematic flowchart that illustrates a method of verifying optical proximity effect correction according to some embodiments of the inventive concept.

FIG. 8 is a schematic flowchart that illustrates operations for verifying optical proximity effect correction according to some embodiments of the inventive concept. The embodiments of methods of verifying optical proximity effect correction (OPC) illustrated in FIG. 8 may include verification method embodiments using a simulation model for verifying a method of embodying a lithography process or a pattern transfer process. That is, FIG. 8 illustrates embodiments in which simulation is executed when the contour image is generated in accordance with the method embodiments described with reference to FIG. 1.

Referring to FIG. 8, the embodiments of the method may include generating a design pattern layout (S201) and generating a correction pattern layout from a design pattern layout by performing optical proximity effect correction (S202) as described above in FIG. 1, and then, a simulation pattern may be generated by executing a simulation using the correction pattern layout (S203). Through the simulation, a shape of the correction pattern layout that is actually embodied on a wafer may be predicted. For example, the simulation may be executed using a simulation model including a mathematical expression for describing or representing a process of transferring and embodying the correction pattern layout to the wafer. The correction pattern layout may be input to the simulation model to execute the simulation, and a simulation pattern that comprises design data of a mask pattern close to an actual measurement may be acquired as a result of the simulation. The simulation pattern may be provided as a contour image including a plurality of image patterns.

Then, a defect pattern may be detected from the acquired simulation pattern (i.e., an image pattern of the contour image) (S204), and the correction pattern layout may be corrected according to the detection result (S205). In other embodiments, according to the detection result, the simulation model may be corrected.

Figure 9:
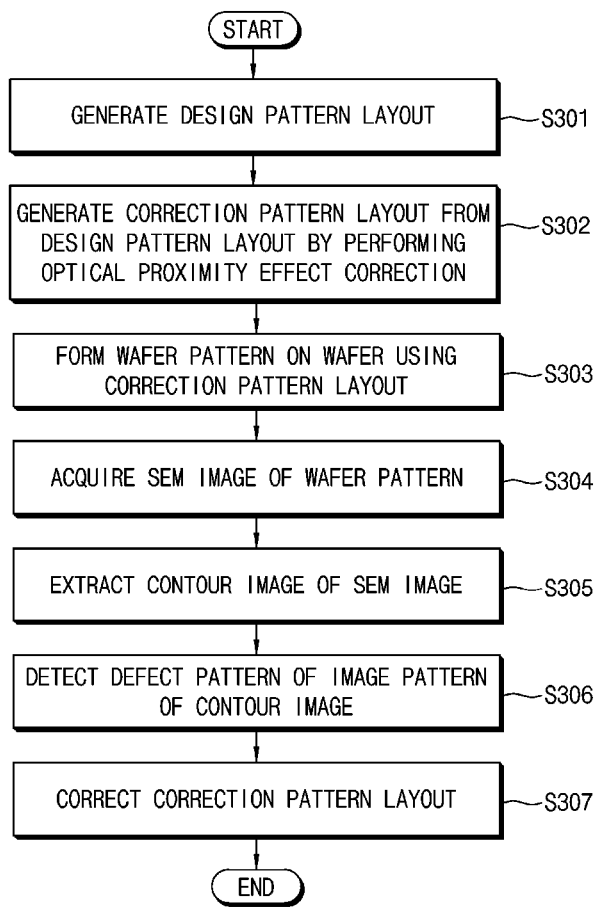
FIG. 9 is a schematic flowchart that illustrates a method of verifying optical proximity effect correction according to some embodiments of the inventive concept.

FIG. 9 is a schematic flowchart that illustrates methods of verifying optical proximity effect correction according to some embodiments of the inventive concept. The methods of verifying optical proximity effect correction illustrated in FIG. 9 may be include verification methods using a contour image of a wafer pattern embodied on a wafer through a lithography process or a pattern transfer process for embodying a semiconductor device on the wafer. That is, FIG. 9 illustrates embodiments in which the contour image of the wafer pattern is generated when the contour image is generated in the method embodiments described with reference to FIG. 1.

Referring to FIG. 9, the operations, according to some embodiments, may include generating the contour image using the correction pattern layout after generating the correction pattern layout from the design pattern layout by performing optical proximity effect correction (S302), and generating the contour image may include forming a wafer pattern on a wafer using the correction pattern layout (S303), acquiring a scanning electron microscopy (SEM) image of the wafer pattern (S304), and extracting a contour image from the SEM image (S304).

The mask pattern according to the correction pattern layout may be formed on a transparent substrate and a photo mask to be used in an exposure process may be manufactured. The photo mask may be manufactured by describing a layout pattern using a chromium film coated on a glass substrate. Exposure and etching processes using the manufactured photo mask may be performed to form the wafer pattern on the wafer (S303).

The wafer pattern may be a photoresist pattern formed as the exposure process is performed on the wafer or a pattern of an insulating layer or a conductive layer, which is formed by a selective etching process using a photoresist pattern as an etch mask, for example, to form gate patterns for various types of transistors included in a memory semiconductor device.

A scanning electron microscopy (SEM) image of the wafer pattern may be acquired using scanning electron microscopy (SEM) equipment (S304). The SEM image may be captured to contain at least some of wafer patterns formed on the wafer. The wafer may include a plurality of chip regions that are separated along with a scribe lane. Wafer patterns may be formed on the chip region to form a semiconductor device. The SEM image may be captured to contain all patterns formed in one chip region on the wafer. In some embodiments, the SEM image may be captured to contain all wafer patterns formed on the wafer, that is, a full-chip region.

A contour image of the SEM image may be extracted using SEM measurement equipment (S305). For example, the contour image may be stored in a GDS file format. The GDS file may be used to view and make various picture files and may correspond to a file format for displaying many pictures. The contour image may include a plurality of contour patterns (i.e., image patterns) corresponding to wafer patterns.

Then, a defect pattern may be detected from contour patterns in the acquired contour image (S306), and the correction pattern layout may be corrected according to the detection result (S307).

Figure 10:
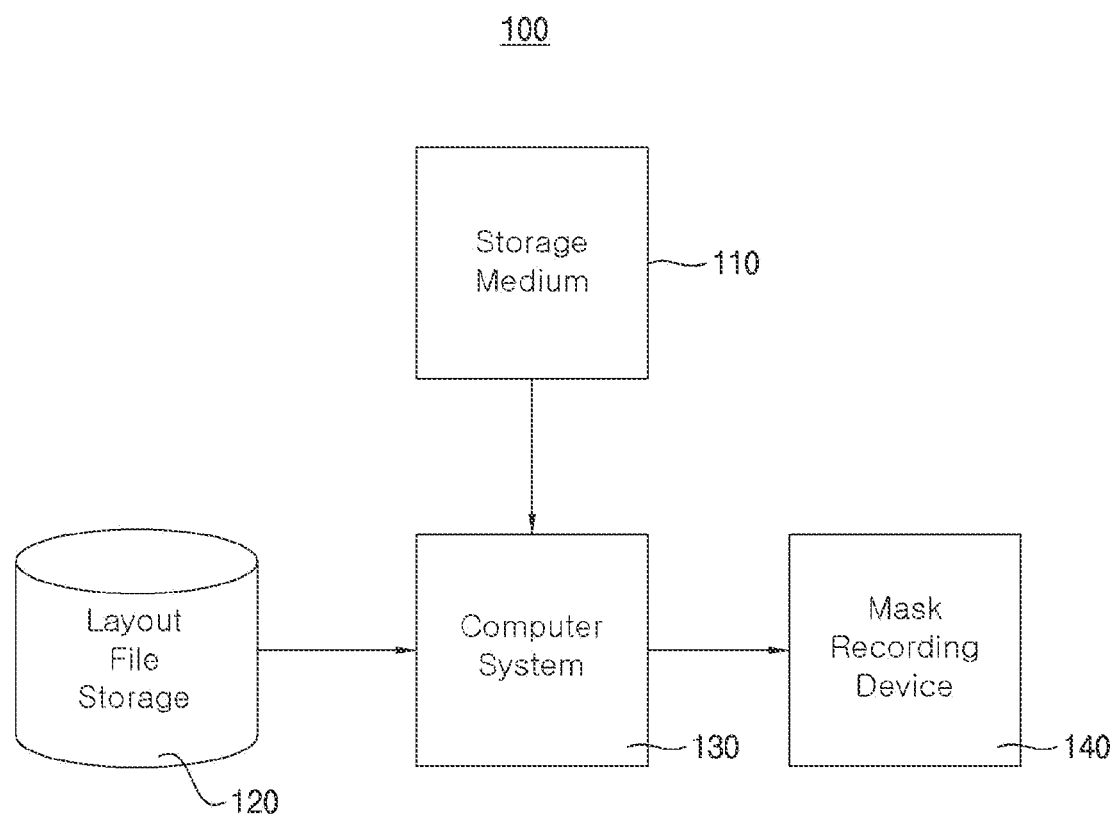
FIG. 10 illustrates a system for verifying optical proximity effect correction according to some embodiments of the inventive concept.

FIG. 10 illustrates a system 100 for verifying optical proximity effect correction according to some embodiments of the inventive concept.

Referring to FIG. 10, a computer system 130 for performing operations of verifying optical proximity effect correction according to some embodiments of the inventive concept may be a general purpose computer or workstation. The computer system 130 may be a standalone or network type, may include a single or multi-processor core for performing calculations, and may be a parallel processing computer system in accordance with various embodiments. The computer system 130 may perform a series of executable commands that are recorded in a program storage medium 110, for example, a compact disk (CD) or a digital video disk (DVD) or are transferred through a wired and wireless communication network, such as the Internet. The computer system 130 may receive a file containing information on the design pattern layout from a layout file storage 120, e.g., a database or other storage media and may execute a command for reading the file. The computer system may be configured to perform one or more of the operations described above with respect to FIGS. 1-9. For example, the computer system 130 may perform optical proximity effect correction according to some embodiments of the inventive concept on a layout, may form a correction pattern layout, may form a contour image using the correction pattern layout, and may generate a file containing the correction pattern layout and the contour image. Then, after the center of gravity of the contour image is calculated, the calculated center of gravity may be compared with a defect pattern verification reference to determine whether a layout satisfying the design pattern layout is formed, and when the defect pattern is detected, the correction pattern layout may be corrected. Then, the layout may be transferred to a mask recording device 140, and, thus, a photo mask may be manufactured.

The system 100 may include a provision module or mechanism configured to provide a design pattern layout, a setting module or mechanism configured to set optical proximity effect correction of the design pattern layout, a formation module or mechanism configured to form a correction pattern layout of the design pattern layout using the optical proximity effect correction, a generating module or mechanism for generating a contour image using the correction pattern layout, a calculation module or mechanism for calculating the center of gravity of the contour image, and a detection module or mechanism for detecting a defect pattern using the center of gravity.

The operations for verifying optical proximity effect correction according to the example embodiments of the inventive concept may quantitatively check the symmetry of image patterns including a contour image using the center of gravity, and, thus, may more rapidly and accurately detect defect patterns having a pattern shape, which is the reason for the error. Accordingly, the result of optical proximity effect correction may be more effectively verified.

Computer readable code for performing one or more of the operations described above with respect to FIGS. 1-9 may be stored on a computer readable recording medium. The computer readable recording medium may be any data storage device that can store data which can thereafter be read by a computer. Examples of the computer readable recording medium include read-only memory (ROM), random-access memory (RAM), CD-ROM, magnetic tapes, floppy disks, optical data storage devices, flash memories, etc. The examples may also include carrier waves. The computer readable recording medium can also be distributed over network coupled computer systems so that the computer readable code is stored and executed in a distributed fashion. Here, a program stored in a recording medium is expressed in a series of instructions used directly or indirectly within a device with a data processing capability, such as, computers. Thus, a term "computer" includes all devices with data processing capability in which a particular function is performed according to a program using a memory, input/output devices, and arithmetic logic.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A method of verifying optical proximity effect correction, comprising:
   generating a design pattern layout comprising a target pattern;
   generating a correction pattern layout from the design pattern layout by performing optical proximity effect correction;
   generating a contour image comprising an image pattern using the correction pattern layout;
   detecting a defect pattern from the image pattern of the contour image; and
   correcting the correction pattern layout using data of the defect pattern,
   wherein the detecting the defect pattern comprises:
   acquiring position data of a center of gravity of the target pattern;
   acquiring position data of a center of gravity of the image pattern; and
   determining whether the image pattern is a defect pattern by comparing a defect pattern detection reference with a distance between the center of gravity of the target pattern and the center of gravity of the image pattern, and
   wherein the acquiring the position data of the center of gravity of the image pattern comprises:
   splitting the image pattern into a plurality of fine patterns; and
   collecting position data of a center of gravity of each of the plurality of fine patterns.

2. The method of claim 1, wherein the position data (CoM) of the center of gravity of the image pattern is represented by the expression:

$$CoM = \sum \frac{\vec{r}_i \cdot d_i}{D}$$

where i is a natural number equal to or greater than 1 and equal to or less than n, n is a natural number equal to or greater than 2, $\vec{r}_i$ is position data of the center of gravity of an $i^{th}$ fine pattern among the plurality of fine patterns, $d_i$ is an area of an $i^{th}$ fine pattern among the plurality of fine patterns, and D is an entire area of the plurality of fine patterns.

3. The method of claim 1, wherein the determining whether the image pattern is the defect pattern comprises:
   when the distance between the center of gravity of the target pattern and the center of gravity of the image pattern is greater than the defect pattern detection reference, determining that the image pattern is the defect pattern.

4. The method of claim 1, wherein the defect pattern detection reference is a reference value of the distance between the center of gravity of the target pattern and the center of gravity of the image pattern.

5. The method of claim 1, wherein the generating the contour image comprises generating the image pattern as a simulation pattern by performing a simulation using the correction pattern layout.

6. The method of claim 1, wherein the generating the contour image comprises:
   forming a wafer pattern on a wafer using the correction pattern layout;

acquiring a scanning electron microscopy (SEM) image of the wafer pattern; and extracting the contour image from the SEM image.

7. The method of claim 1, wherein the correction pattern layout comprises a standard pattern and a correction pattern, and wherein the correcting the correction pattern layout comprises offset-correcting a position of the correction pattern with respect to the standard pattern based on the position data of the center of gravity of the image pattern.

8. The method of claim 1, further comprising:

setting the defect pattern detection reference;

wherein setting the defect pattern detection reference comprises:

setting position data on a wafer; and selecting a defect pattern determination target pattern among image patterns of the contour image.

9. The method of claim 1, wherein the acquiring the position data of the center of gravity of the target pattern comprises setting the center of gravity of the target pattern to an original point.

10. A method of verifying optical proximity effect correction, comprising:

generating a design pattern layout comprising a target pattern;

generating a correction pattern layout from the design pattern layout by performing optical proximity effect correction;

generating a simulation pattern by performing a simulation using the correction pattern layout; and detecting a defect pattern from the simulation pattern, wherein the detecting the defect pattern comprises:

acquiring position data of a center of gravity of the target pattern;

acquiring position data of a center of gravity of the simulation pattern; and determining whether the simulation pattern is the defect pattern using the position data of the center of gravity of the target pattern and the position data of the center of gravity of the simulation pattern, wherein the acquiring the position data of the center of gravity of the simulation pattern comprises:

splitting the simulation pattern into a plurality of fine patterns; and collecting position data of a center of gravity of each of the plurality of fine patterns.

11. The method of claim 10, wherein the position data (CoM) of the center of gravity of the simulation pattern is represented by the expression:

$$CoM = \sum \frac{\vec{r}_i \cdot d_i}{D}$$

where i is a natural number equal to or greater than 1 and equal to or less than n, n is a natural number equal to or greater than 2, $\vec{r}_i$ is position data of the center of gravity of an $i^{th}$ fine pattern among the plurality of fine patterns, $d_i$ is an area of an $i^{th}$ fine pattern among the plurality of fine patterns, and D is an entire area of the plurality of fine patterns.

12. The method of claim 10, wherein the determining whether the simulation pattern is the defect pattern comprises:

calculating a distance between the center of gravity of the target pattern and the center of gravity of the simulation pattern, and comparing the calculated distance with a defect pattern detection reference.

13. The method of claim 12, wherein the determining whether the simulation pattern is the defect pattern comprises:

when the calculated distance is greater than the defect pattern detection reference, determining that the simulation pattern is the defect pattern.

14. The method of claim 12, further comprising:

after the detecting the defect pattern, extracting coordinates of the defect pattern.

15. The method of claim 12, further comprising:

after the detecting the defect pattern, correcting the correction pattern layout using the position data of the center of gravity of the simulation pattern.

16. A method of verifying optical proximity effect correction, comprising:

generating a design pattern layout comprising a target pattern;

generating a correction pattern layout from the design pattern layout by performing optical proximity effect correction;

forming a wafer pattern on a wafer using the correction pattern layout;

generating a contour image comprising an image pattern corresponding to the wafer pattern; and detecting a defect pattern from the image pattern of the contour image, wherein the detecting the defect pattern comprises:

setting a defect pattern detection reference;

acquiring position data of a center of gravity of the image pattern; and determining whether the wafer pattern is the defect pattern using the defect pattern detection reference and the position data of the center of gravity of the image pattern, wherein the acquiring the position data of the center of gravity of the image pattern comprises:

splitting the image pattern into a plurality of fine patterns;

collecting position data of a center of gravity of each of the plurality of fine patterns; and calculating the position data of the center of gravity of the image pattern, the position data (CoM) of the center of gravity of the image pattern being represented by the expression:

$$CoM = \sum \frac{\vec{r}_i \cdot d_i}{D}$$

where i is a natural number equal to or greater than 1 and equal to or less than n, n is a natural number equal to or greater than 2, $\vec{r}_i$ is position data of the center of gravity of an $i^{th}$ fine pattern among the plurality of fine patterns, $d_i$ is an area of an $i^{th}$ fine pattern among the plurality of fine patterns, and D is an entire area of the plurality of fine patterns.

17. The method of claim 16, wherein the generating the contour image comprises:

acquiring a scanning electron microscopy (SEM) image of the wafer pattern; and extracting the contour image from the SEM image.

18. The method of claim 16, wherein the setting the defect pattern detection reference comprises setting a reference value of a distance between a center of gravity of the target pattern and the center of gravity of the image pattern.

19. The method of claim 16, wherein the setting the defect pattern detection reference comprises setting a center of gravity of the target pattern as an original point of (0, 0).

20. The method of claim 19, wherein the determining whether the wafer pattern is the defect pattern comprises:
   calculating a distance between the original point and a center of gravity of the contour image; and
   comparing the calculated distance with the defect pattern detection reference.

* * * * *